United States Patent [19]

Staver et al.

[11] Patent Number: 5,463,569
[45] Date of Patent: Oct. 31, 1995

[54] DECIMATION FILTER USING A ZERO-FILL CIRCUIT FOR PROVIDING A SELECTABLE DECIMATION RATIO

[75] Inventors: Daniel A. Staver; Donald T. McGrath, both of Scotia, N.Y.

[73] Assignee: General Electric Company, Schencetady, N.Y.

[21] Appl. No.: 265,343

[22] Filed: Jun. 24, 1994

[51] Int. Cl.⁶ .................................................. G06F 15/31
[52] U.S. Cl. ................................................. 364/724.1
[58] Field of Search ........................ 364/724.1, 724.01, 364/737, 736, 745

[56] References Cited

U.S. PATENT DOCUMENTS

| | | |
|---|---|---|
| 4,547,726 | 10/1985 | Premerlani . |
| 4,715,000 | 12/1987 | Premerlani . |
| 4,723,216 | 2/1988 | Premerlani . |
| 4,896,156 | 1/1990 | Garverick . |
| 4,937,577 | 6/1990 | Rich et al. ............................ 364/724.1 |
| 4,951,052 | 8/1990 | Jacob et al. . |
| 4,953,117 | 8/1990 | Lagadec ................................ 364/724.1 |
| 5,126,961 | 6/1992 | Garverick . |
| 5,126,961 | 6/1992 | Garverick . |
| 5,134,578 | 7/1992 | Garverick et al. . |
| 5,142,489 | 8/1992 | Yamaki ..................................... 364/736 |
| 5,157,395 | 10/1992 | Del Signore et al. ............... 364/724.1 |
| 5,181,033 | 1/1993 | Yassa et al. . |
| 5,301,121 | 4/1994 | Garverick et al. . |
| 5,301,134 | 4/1994 | Maruyama .......................... 364/724.1 |

OTHER PUBLICATIONS

"A Use of Limit Cycle Oscillations to Obtain Robust Analog–to–Digital Converters", James C. Candy, IEEE Transactions on Communications, vol. COM–22, No. 3, pp. 298–305, Mar., 1974.

"A Programmable Mixed Signal ASIC for Power Management", D. McGrath, P. Jacob, H. Sailer, IEEE 1992 Custom Integrated Circuits Converence, pp. 19.4.1–19.4.3.

"Using Triangularly Weighted Interpolation to Get 13–Bit PCM from a Sigma–Delta Modulator", James C. Candy, Y. C. Ching, D. S. Alexander, IEEE Transactions on Communications, pp. 1268–1275, Nov., 1976.

"A Programmable Mixed–Signal ASIC for Power Metering", S. L. Garverick, D. T. McGrath, R. D. Baertsch, K. Fujino, 1991 IEEE International Solid State Circuits Conference, Digest of Technical Papers, pp. 36–37.

"A Programmable Mixed–Signal ASIC for Power Metering", S. L. Garverick, K. Fujino, D. T. McGrath, R. D. Baertsch, IEEE Journal of Solid–State Circuits, vol. 26, No., 12, pp. 2008–2016, Dec. 1991.

*Primary Examiner*—Tan V. Mai
*Attorney, Agent, or Firm*—Enrique J. Mora; Marvin Snyder

[57] ABSTRACT

A decimation filter for filtering an externally derived stream of quantized electrical signals includes a coefficient generator responsive to a set of externally derived decimation-ratio select signals to provide a separate normalized coefficient signal at each respective one of a plurality of output ports. The coefficient generator employs a zero-fill circuit comprising first and second circuits which selectively ripple therethrough an scaling-control output signal from a demultiplexer unit in order to provide the normalized coefficient signals. An accumulator is coupled to the coefficient generator to receive each normalized coefficient signal generated therein. The accumulator receives the stream of quantized electrical signals so as to produce, upon masking with respective ones of the received normalized coefficient signals, a plurality of accumulator output signals. An overflow detector is coupled to the accumulator to detect and correct any overflow condition arising in the accumulator.

19 Claims, 14 Drawing Sheets

DECIMATION FILTER USING A ZERO-FILL CIRCUIT FOR PROVIDING A SELECTABLE DECIMATION RATIO

RELATED APPLICATIONS

This application is related to U.S. patent application Ser. No. 08/265,475, entitled "Decimation Filter Having a Selectable Decimation Ratio," filed concurrently with the present application, assigned to the assignee of the present invention and herein incorporated by reference.

FIELD OF THE INVENTION

This invention relates to decimation filters, and more particularly, to decimation filters such as for use with sigma-delta modulators.

BACKGROUND OF THE INVENTION

Several conflicting objectives are present in the field of high performance data acquisition for electrical power measurement, metering, and management. A first objective is high data resolution. The availability of high resolution analog-to-digital conversion methods, such as with sigma-delta modulators, combined with the power of state of the art digital signal processors provides the capability to achieve significant levels of accuracy. Thus, complex signal processing may be performed on precise data using conventional signal processing architectures. However, a second objective is increased signal processing bandwidth. An inherent tension exists between these two objectives in that increasing bandwidth typically occurs at the expense of data resolution. Yet, a third objective is compactly integrated or electronic circuitry that requires less power to operate. A need thus exists for a decimation filter having the capability to balance high data resolution demands against large bandwidth demands, as desired for power measurement, metering, and management systems, while having the size and power requirements of a conventional electronic or integrated circuit component.

It is further desirable to provide a decimation filter with improved normalization or scaling characteristics in order to improve data access speed and minimize filter circuitry complexity. U.S. patent application Ser. No. 08/025,456 by J. E. Krisciunas et al, filed Mar. 3, 1993, assigned to the assignee of the present application and herein incorporated by reference, describes a technique which, although effective in providing suitable normalization for a desired decimation ratio, employs relatively complex synchronous conversion on the filter output signals. The technique described therein uses a parallel-to-serial (PISO) converter and/or tapped delays which, in general, are not suitable for asynchronously reading out filter output signals for any additional signal processing. The present invention advantageously provides a coefficient generator having the capability of providing coefficient signals with variable scaling. U.S. patent application Ser. No. 08/265,475, by D. A. Staver et al, filed concurrently herewith and herein incorporated by reference, describes a coefficient generator which, although capable of efficiently providing coefficient signals with variable scaling, employs circuitry which somewhat may not be as readily expandable as the coefficient generator of the present invention. In accordance with another objective of the present invention, an overflow detector is employed in the decimation filter to detect and correct any overflow condition which can occur under predetermined conditions. As described in U.S. patent application Ser. No. 08/025,456 by J. E. Krisciunas et al, one way to avoid the overflow condition is to modify the ideal response of the filter. In general, this modification results in a slight alteration in the magnitude response of the decimation filter realization which can introduce substantial distortion at relatively low decimation ratios. Thus, there is a need to provide a decimation filter in which the magnitude response is impervious to any selected decimation ratio.

SUMMARY OF THE INVENTION

Generally speaking, the present invention fulfills the foregoing needs by providing a decimation filter for filtering at least one externally derived stream of quantized electrical signals having a predetermined rate. The filter comprises a coefficient generator responsive to a set of externally derived decimation-ratio select signals to provide a separate normalized coefficient signal at each respective one of a plurality of output ports. The coefficient generator employs a zero-fill circuit comprising first and second circuits which selectively ripple therethrough a predetermined scaling-control output signal from a demultiplexer unit in order to provide the normalized coefficient signals. An accumulator is coupled to the coefficient generator to receive each normalized coefficient signal generated therein. The accumulator receives the stream of quantized electrical signals so as to produce, upon masking with respective ones of the received normalized coefficient signals, a plurality of accumulator output signals. An overflow detector is coupled to the accumulator to detect any overflow condition arising in the accumulator.

A method for decimation filtering at least one stream of externally derived binary signals in accordance with the invention comprises the steps of: generating a predetermined sequence of normalized coefficient signals in response to a set of externally derived decimation-rate select signals; receiving the externally derived stream of binary signals; masking the received externally derived stream of binary signals with the predetermined sequence of normalized coefficient signals; and accumulating the masked signals to provide a filtered signal. The step of generating the predetermined sequence of normalized coefficient signals comprises the steps of: providing at a selected one of S demultiplexer output ports a predetermined scaling-control signal wherein S is a predetermined integer corresponding to a number of selectable decimation ratios provided by the decimation filter; generating a separate counter signal at selected ones of (N+S−1) counter output ports wherein N is a predetermined integer chosen so that $2^N$ and $2^N-(S-1)$, respectively, constitute upper and lower decimation ratio bounds; and generating N+S−1 normalized signals upon predeterminedly zero-filling respective ones of of the generated (N+S−1) counter output signals.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof, may best be understood by reference to the following detailed description when read with the accompanying drawings in which:

FIGS. 9A–9C are assembled with respect to each other;

DETAILED DESCRIPTION OF THE INVENTION

Figure 1:
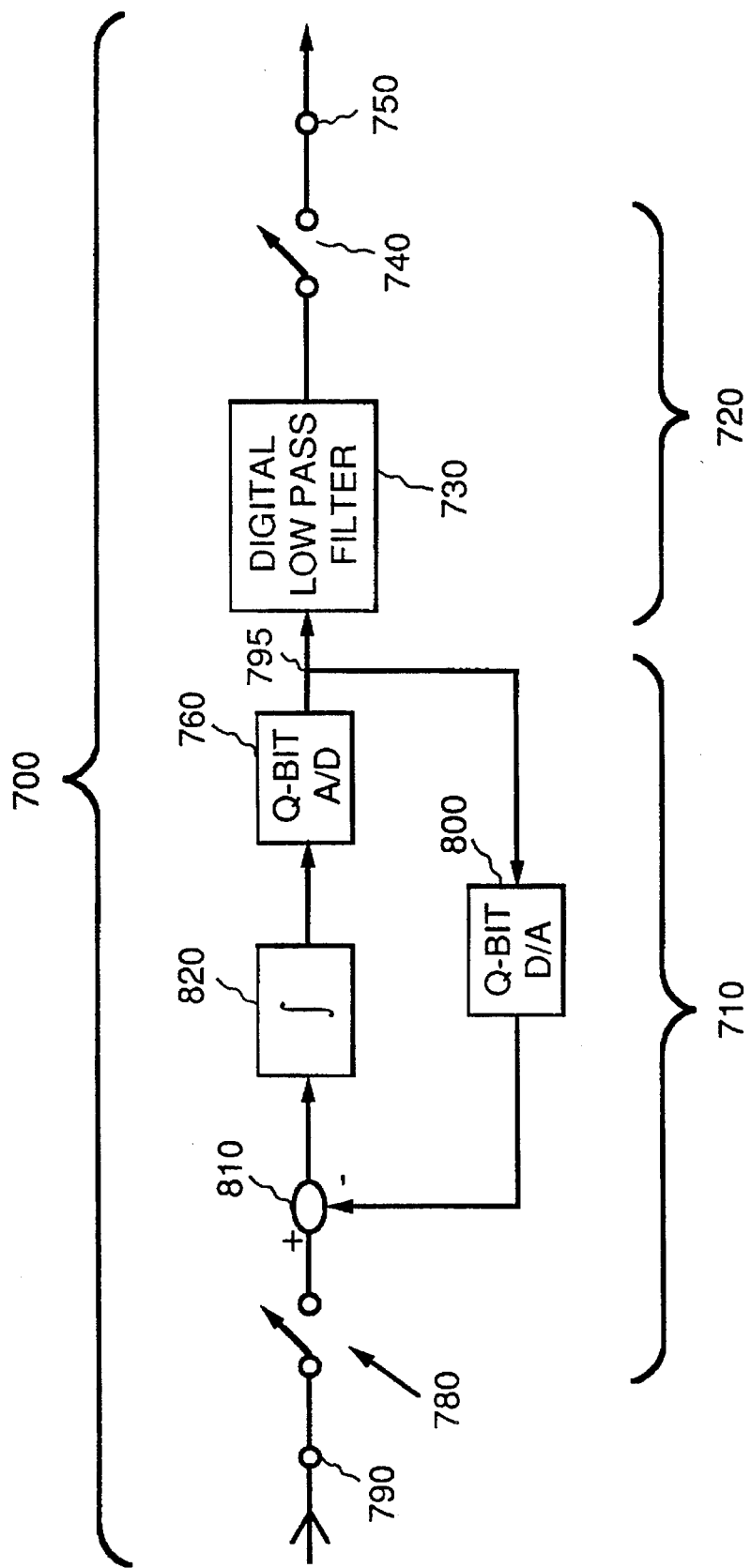
FIG. 1 is a block diagram of one embodiment of a sigma-delta modulator such as may be incorporated in an analog-to-digital converter having a decimation filter which has a selectable decimation ratio capability in accordance with the invention.

Conventional analog-to-digital conversion frequently involves use of oversampled analog-to-digital converters. One example of such an analog-to-digital converter that employs a sigma-delta modulator is illustrated in FIG. 1. Systems in which analog-to-digital converters and sigma-delta modulators may prove useful are described in U.S. Pat. No. 5,181,033 entitled "Digital Filter for Filtering and Decimating Delta Sigma Modulator Output Signals," by Yassa et al., issued Jan. 19, 1993, U.S. Pat. No. 5,126,961, entitled "Plural-Channel Decimator Filter, as for Sigma-Delta Analog-to-Digital Converters," by Carverick, issued Jun. 30, 1992, U.S. Pat. No. 5,134,578, entitled "Digital Signal Processor for Selectively Performing Cordic, Division or Square-Rooting Procedures," by Garverick et al., issued Jul. 28, 1992, U.S. Pat. No. 4,951,052, entitled "Correction of Systematic Error in the Oversampled Analog-to-Digital Converters," by Jacob et al., issued Aug. 21, 1990, and U.S. Pat. No. 4,896,156, entitled "Switched-Capacitance Coupling Network for Differential-Input Amplifiers Not Requiring Balanced Input Signals," by Garverick, issued Jan. 23, 1990, all of the foregoing patents assigned to the assignee of the present invention and herein incorporated by reference, and described in "A Programmable Mixed Signal ASIC for Power Metering," by S. L. Carverick, K. Fujino, D. T. McGrath, and R. D. Baertsch, IEEE Journal of Solid State Circuits, Vol. 26, No. 12, December 1991, pp. 2008–16, and "A Programmable Mixed Signal ASIC for Power Management," by D. T. McGrath, P. Jacobs, and H. Sailer, IEEE 1992 Custom Integrated Circuits Conference, pp. 19.4.1–19.4.2, both of which are herein incorporated by reference.

The technique of oversampling is frequently used in performing analog-to-digital conversion. An example of an analog-to-digital converter employing this technique is illustrated in FIG. 1. In this illustration, a converter 700 comprises a modulator 710 and a decimator 720. Modulator 710 produces coarse, or low-resolution, samples of its input signal, at a rate much greater than that required by the Nyquist theorem. These coarse samples are subsequently low-pass filtered by decimator 720 to produce high-resolution samples at or above the Nyquist rate of the input signal of the modulator.

As illustrated, modulator 710 includes negative feedback to node 810, which is coupled to the input of an integrator 820, the output of which is coupled to the input of a Q-bit analog-to-digital converter 760. The output of analog-to-digital converter 760 is coupled to a Q-bit digital-to-analog converter 800, the output of which is coupled to node 810. An analog input signal applied to terminal 790 is sampled by a sampling device 780, illustrated as a single-pole single throw switch, at a rate $f_{ds}$ much higher than the Nyquist rate. These samples are compared to a Q-bit estimate of the input signal provided by digital-to-analog converter 800, using the difference signal at node 810. The difference, or error signal, produced at node 810 is integrated by integrator 820, then quantized by Q-bit analog-to-digital converter 760 to produce the Q-bit estimate of the input signal at terminal 795 which is supplied to the input port of digital-to-analog converter 800 and a decimator 720. The combination of feedback and error-signal integration serves to shape the spectrum of the quantization noise such that it may be more completely removed by the low-pass filtering. The effectiveness of the noise shaping is improved when the number of integrators in the feedback loop (i.e., the order of the modulator) increases, but serious stability problems are encountered for modulators of order greater than two.

As illustrated in FIG. 1, the decimator comprises a digital low-pass filter 730 followed by signal sampling device 740, shown as a single-pole single throw switch, to provide a discrete output signal at a node or terminal 750. This filtering and decimation results in a large fraction of the quantization noise being removed to thereby provide a high resolution output signal. Nonetheless, it will be appreciated that the resolution is gained by having a throughput much lower than the initial sampling rate, $f_{ds}$. The ratio of the initial sampling rate to the modulator conversion rate is typically referred to as the oversampling ratio R of the modulator. As described in "A Comparison of Modulation Networks for High-Order Oversampled S D Analog-to-Digital Converters," *IEEE Transactions on Circuits and Systems*, Vol. 38, pp. 145–159, by D. B. Ribner, published in February 1991, and herein incorporated by reference, the resolution (bits) of such an analog-to-digital conversion is governed by the number of quantization bits Q, the oversampling ratio R, and the order of the modulator, L, in accordance with the following expression:

$$\text{Bits} = (L + 1/2) \log_2 R - \log_2 \left[ \frac{\pi^L}{\sqrt{2L+1}} \right] + \log_2(2^{Q-1}) \quad [1]$$

This expression may be derived from a linear approximation to the modulator and by assuming an ideal lowpass filter. Equation [1] shows, in essence, that each time the oversampling ratio R is doubled, resolution is improved by L+½ bits.

Equation [1] may be evaluated for a first order modulator for various oversampling ratios. It will be appreciated that in accordance with equation [1] above, the higher the oversampling ratio the greater the corresponding number of bits, given a predetermined order for the sigma-delta modulator. For some applications, use of a one-bit quantizer may be desirable. One advantage of such a quantizer is that it may avoid harmonic distortion or other nonlinearities typically associated with multiple bit quantizers. In contrast with multiple bit quantizers, a one-bit quantizer is inherently linear because its output signal takes on one of two distinct values and, thus, determines a straight line. A sigma-delta modulator using a one-bit quantizer has been analyzed in "A Use of Limit Cycle Oscillations to Obtain Robust Analog-to-Digital Converters," *IEEE Transactions on Communications*, COM-22(3), pp. 298–305, by J. C. Candy, published in March, 1974, and herein incorporated by reference. Equation [2] below provides $q(n\tau)$, the nth quantized signal, where $\tau$ represents the cycle period:

$$q(n\tau) = \frac{1}{\tau} \int_0^{n\tau} [x(t) - q(t)]dt + \epsilon(n\tau) \quad [2]$$

The quantization represented by the addition of an error, $\epsilon$, is assumed to be uncorrelated to the input signal, x. Because q(t) is a sampled function, its integral may be expressed as a summation, which may be rearranged and divided by R, the number of cycles in a sample time, providing equation [3] below.

$$\frac{1}{R} \sum_{n=0}^{R} q(n\tau) = \frac{1}{R\tau} \int_0^{R\tau} x(t)dt + \frac{\epsilon(R\tau)}{R} \quad [3]$$

Equation [3] indicates that the average quantization error will be R times smaller than the "coarse" quantizer error. Thus, high resolution may be obtained by repeated feedback with a sufficiently large R.

Figure 2:
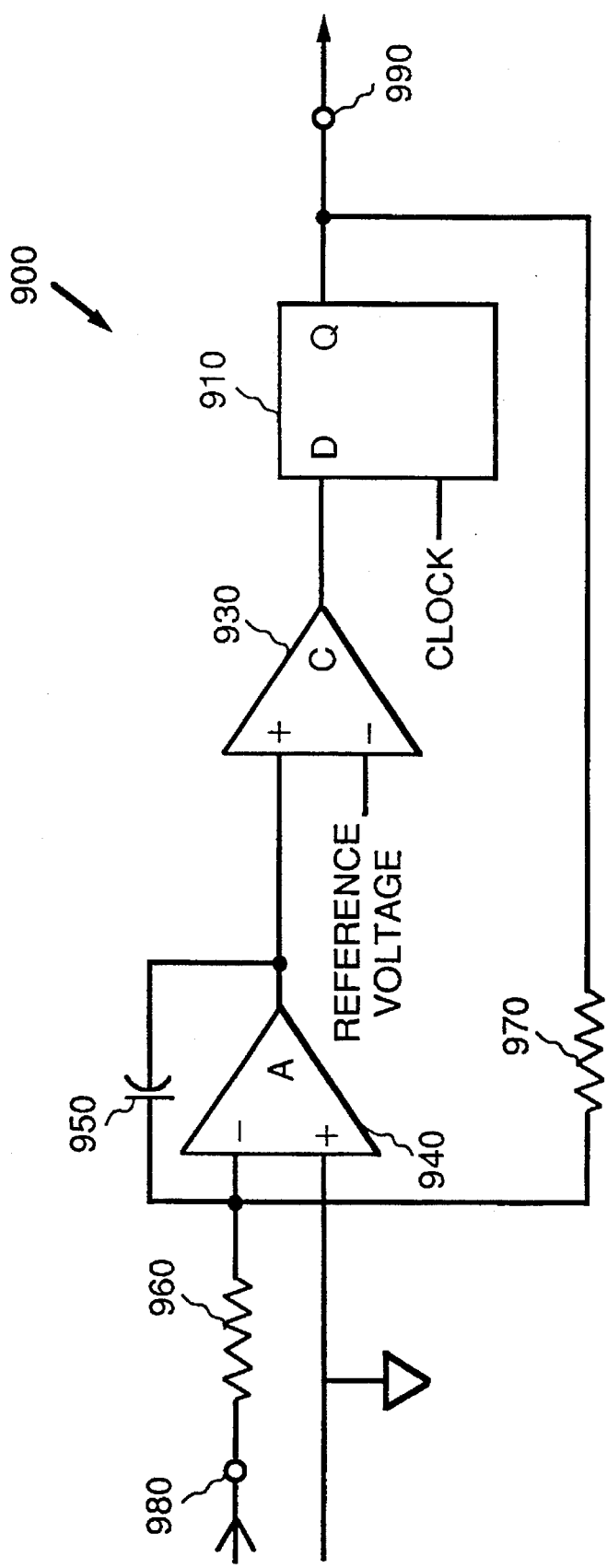
FIG. 2 illustrates an embodiment of a sigma-delta modulator comprising electrical or electronic components, such as may be incorporated in an analog-to-digital converter having a decimation filter in accordance with the invention.

FIG. 2 illustrates one embodiment of the first order sigma-delta modulator for incorporation in an analog-to-digital converter having a decimation filter in accordance with the invention. As illustrated, the input signal, such as an electrical voltage, is provided at a terminal 980 and scaled or attenuated by a resistance 960. An amplifier 940 performs integration due to the presence of a capacitor 950 in a negative feedback configuration. Likewise, digital quantization is accomplished by coupling the output signal of amplifier 940 to the positive input terminal of an analog comparator 930. As illustrated in FIG. 2, digital-to-analog conversion takes place because the output signal of comparator 930 is latched by a flip-flop 9 10 and provided to amplifier 940, as feedback, through a resistance 970. More specifically, one bit analog-to-digital conversion takes place due to the feedback provided through resistance 970 to integrating amplifier 940. This feedback through resistor 970 is equivalent to the feedback through digital-to-analog converter 800 in FIG. 1. The output signal at a node 990 of the modulator will have a spectral output corresponding to the shape illustrated in FIG. 3. Similar approaches have been employed, such as described in "A Seven-Channel Mixed Analog/Digital Signal Acquisition and Processing Architecture," a masters thesis for Rensselaer Polytechnic Institute, prepared by P. L. Jacob in December 1988, and herein incorporated by reference.

Figure 3:
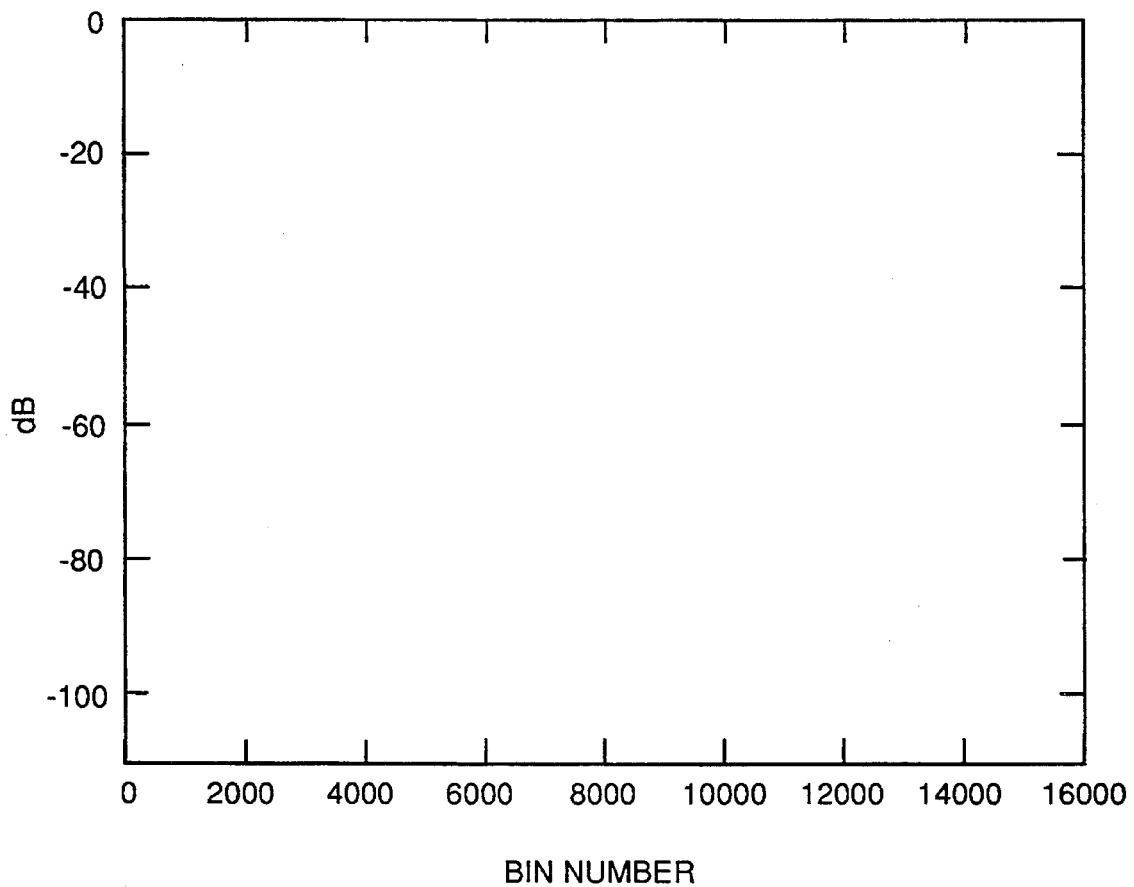
FIG. 3 shows spectral shaping of quantization noise such as may be accomplished by the use of a sigma-delta modulator.

As previously discussed, an oversampling modulator shapes the spectrum of the quantization noise such that most of the noise energy is allocated to high frequencies. This is illustrated in FIG. 3, which is a plot of the simulated quantization noise spectral density of a third-order, one-bit sigma-delta modulator; a first-order modulator is qualitatively similar. The highest frequency illustrated, bin number 16000, corresponds to $f_{ds}/2$. Since the decimator filters quantization noise energy between $f_{ds}/2R$ and $f_{ds}/2$, then reduces the sampling rate to $f_{ds}/R$, a trade-off exists between resolution and sampling rate which may be controlled by adjusting parameter R.

One embodiment of a decimation filter is a rectangular window filter. This conventional type of lowpass filter offers simplicity. Rectangular window filtering performed in the time domain has the frequency response of a sinc function. For a window of duration or length t, the frequency response is sinc (ft) with the first zero occurring at f=1/t, where in the context of the invention sinc(x) refers to $[\sin(\pi x)]/\pi x$. The window length or duration t is selected such that the first zero occurs at the conversion rate $f_{ds}/R$. Thus, $t=R/f_{ds}$. This filter has the desirable characteristic of linear phase. The various channels of a multi-channel system pass through the same linear phase decimation filter and thus realize substantially the same time delay for the relevant range of input frequencies.

Figure 7:
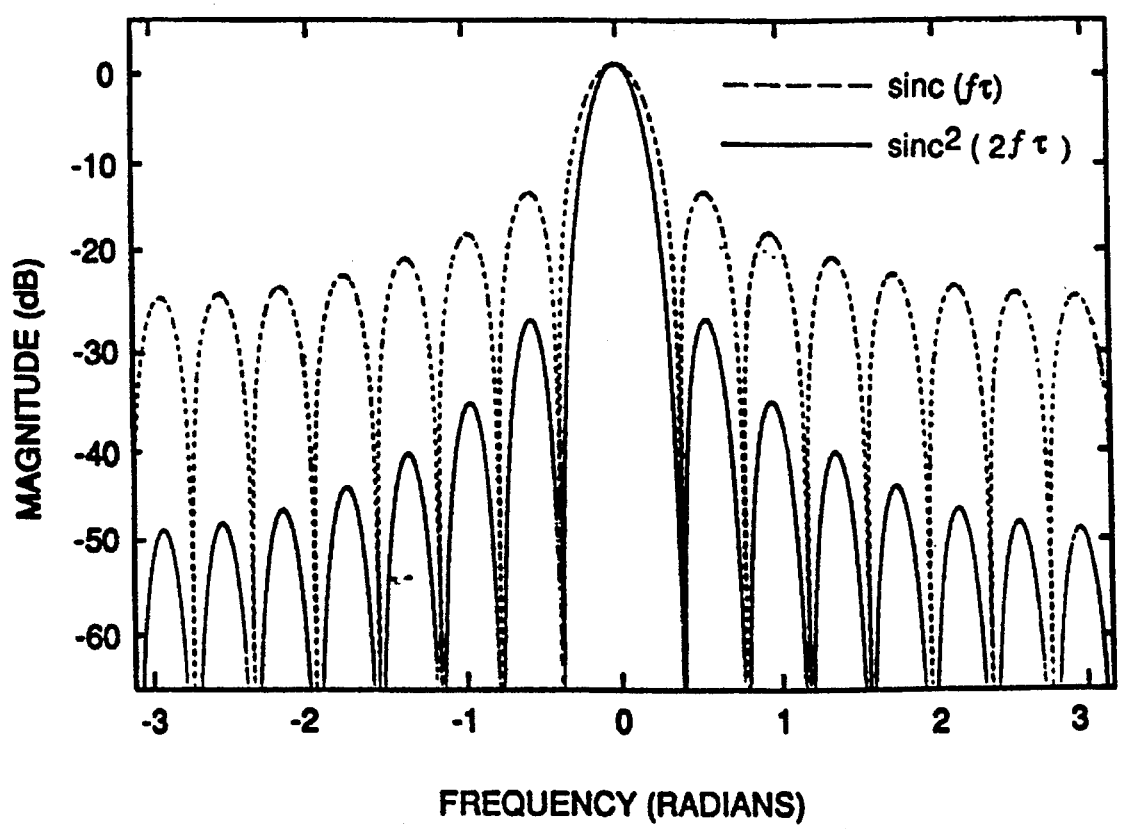
FIG. 7 shows the frequency response for a rectangular "window" decimation filter and a triangular "window" decimation filter.

Despite the simplicity of a rectangular window decimation filter, a "sharper" cutoff in the frequency domain may be achieved by using higher order filtering. One such embodiment is the so-called double interpolation filter in which the cutoff is sharper and stopband attenuation is increased in comparison with the rectangular window. One advantage of such a filter is that it reduces the amount of noise "leaking" through the stopband and thus aliased back into the baseband following decimation. One embodiment of a double interpolation filter is the triangular window, having a frequency response of $sinc^2$, such as described in the aforementioned Candy paper and in "Using Triangularly Weighted Interpolation to Get 13-Bit PCM from a Sigma-Delta Modulator," *IEEE Communications*, Com. 24, pp. 1268–1275, by J. C. Candy, Y. C. Ching, and D. S. Alexander, published in November, 1976 and herein incorporated by reference. Thus, for a filter of length t, the frequency response is $sinc^2(f \cdot t/2)$ with the first zero at f=2/t. It will now be appreciated that to maintain the first zero at the decimation frequency, the filter length for this particular embodiment becomes doubled. Thus, $t=2R/f_{ds}$ places zero frequency response at the conversion rate $f_{ds}/R$. FIG. 7 illustrates the frequency response of a first order rectangular filter of length t=16 and a second order triangular filter of length 2t=32, demonstrating that a sharper cutoff and improved stopband attenuation are achieved by the second order filter.

Figure 4:
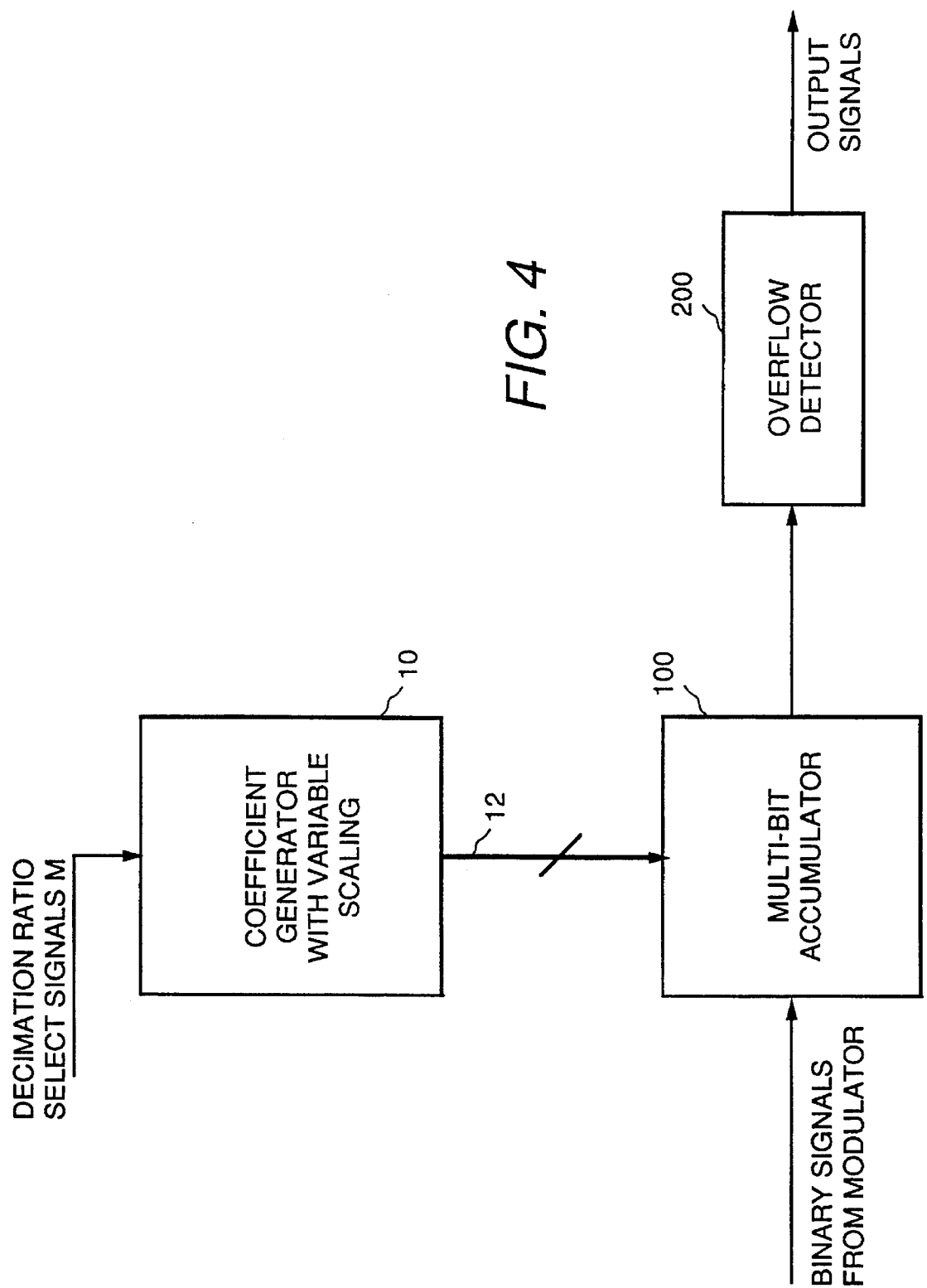
FIG. 4 is a schematic block diagram of a decimation filter which uses a coefficient generator with variable scaling to provide normalized coefficients in accordance with the invention.

FIG. 4 illustrates one embodiment of a decimation filter having a selectable decimation ratio in accordance with the present invention. As used herein the expression "decimation ratio" refers to the reduction or down-conversion factor in sampling rate provided by the decimation filter. In particular, coefficient generator 10 is designed to provide a separate normalized coefficient signal at each of a plurality of output ports in response to a set M of externally derived decimation-ratio select signals. A multi-bit accumulator 100 is coupled to generator 10 to receive the normalized coefficient signals. Accumulator 100 also receives a stream of quantized or binary signals from modulator 710, for example (FIG. 1). Normalization is desirable because depending on the decimation ratio selected, the output signals of the filter will be provided in binary multiples for the same modulator input signals, i.e., without suitable normalization for any given decimation ratio selected, a user will not be able to properly interpret the correct value for the filtered signals produced by the decimation filter. U.S. patent application Ser. No. 08/025,456 by J. E. Krisciunas et al, filed March 3, 1993, describes a technique which, although effective in providing suitable normalization for a desired decimation ratio, employs a somewhat complex synchronous conversion on accumulator output signals. Briefly, the technique described therein uses at least a parallel-to-serial (PISO) converter and/or suitable tapped delays. The aforementioned technique, in general, is not applicable to asynchronous readout of the accumulator output signals for any additional signal processing. As will be explained shortly hereafter, the present invention advantageously provides in coefficient generator 10 the capability of providing coefficient signals with variable scaling. Since the coefficient signals supplied to the accumulator are suitably normalized, the accumulator output signals are ready to be utilized for further processing without having to employ the aforementioned synchronous conversion.

In accordance with another advantage of the present invention, an overflow detector 200 is coupled to accumulator 100 to detect and correct any overflow condition which may occur in the accumulator under predetermined conditions. The overflow condition arises whenever the modulator output signal is at full scale, that is, during a predetermined triangular "window" the modulator supplies a stream of quantized signals, each having a binary value of "ONE", and consequently the summing or accumulating capacity of the accumulator is exceeded when the modulator output signal is at full scale. As described in U.S. patent application Ser. No. 08/025,456 by J. E. Krisciunas et al, one way to avoid the overflow condition is to always reduce the triangular "window" count by one, for example, by dropping the next to last coefficient of the triangular "window". This modification results in a slight alteration in the magnitude response of the decimation filter realization which can introduce substantial distortion at relatively low decimation ratios. Because of overflow detector 200, the decimation filter is no longer subject to the above-described modification to its triangular window and consequently, regardless of the selected decimation ratio, the magnitude response remains unaffected.

Figure 5:
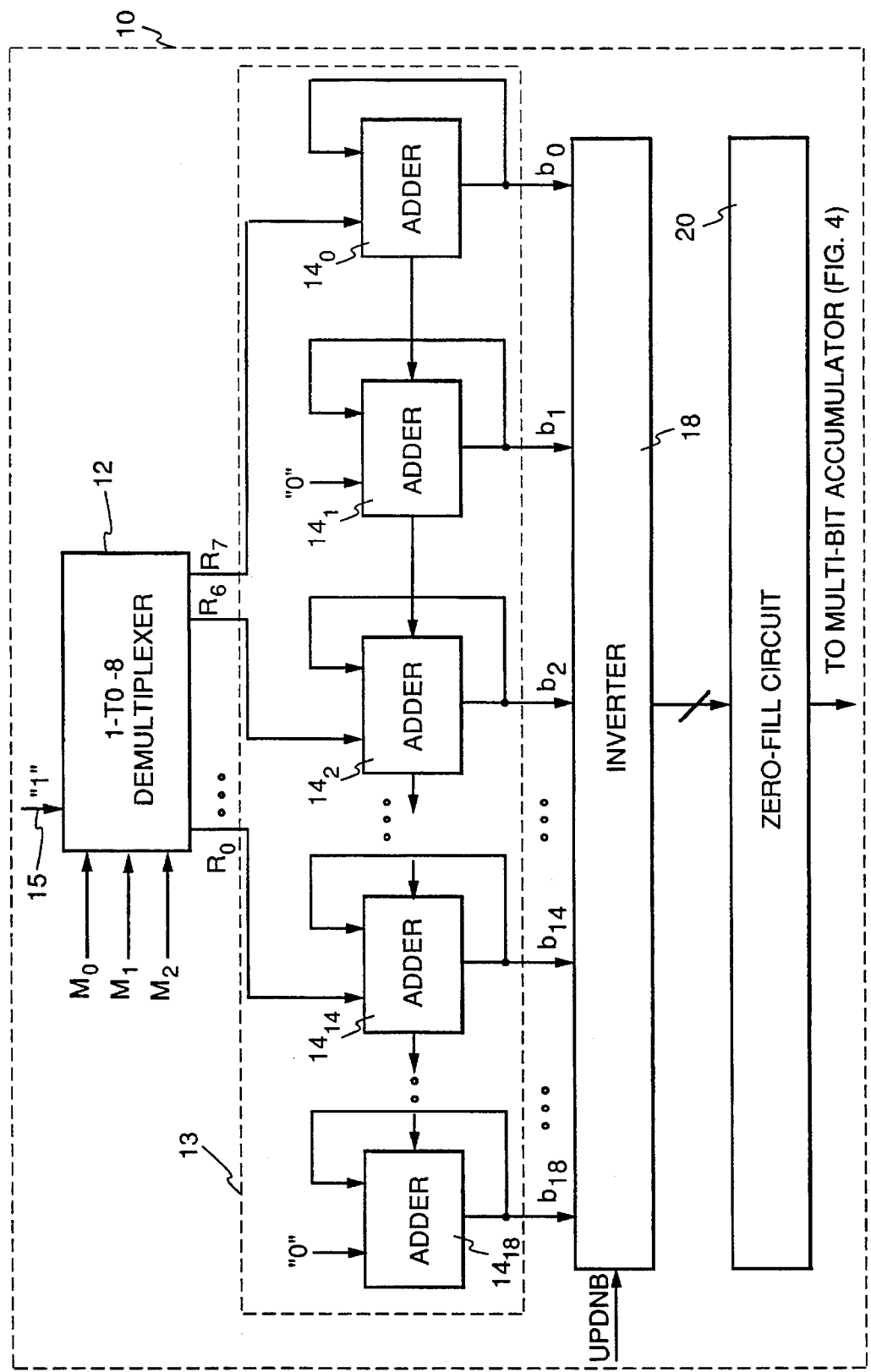
FIG. 5 shows further details in block diagram form of the coefficient generator shown in FIG. 4 including its zero-fill circuit.

Coefficient generator 10, as shown in FIG. 5, comprises a demultiplexer unit 12 responsive to a set M of decimation-ratio control signals, designated as $M_0$, $M_1$ and $M_2$. Demultiplexer 12 is connected to provide at a selected one of S demultiplexer output ports ($R_0$–$R_7$) a predetermined scaling-control signal chosen to have a level corresponding to logic "ONE" and received by demultiplexer 12 at a single input port 15. Letter S represents a predetermined integer corresponding to the number of selectable decimation ratios provided by the decimation filter. By way of example, S here is eight and hence demultiplexer 12 is conveniently chosen as a 1-to-8 demultiplexer, that is, single input port 15 is connected to one of demultiplexer output ports $R_0$–$R_7$ based on the state or condition for decimation-ratio control signals $M_0$–$M_3$. It can be shown that that the number of decimation-ratio control signals in set M is chosen in general so that the following property is satisfied $$M=M_{[LOG_2(S)-1:0]}$$

so that in the case of S=8, the number of control signals is three, previously designated as $M_0$, $M_1$ and $M_2$.

An (N+S–1)-bit counter 13 comprising a plurality of N+S–1 adders 14$_0$–14$_{18}$ is responsive to a suitable counter clock or control signal (not shown) which substantially corresponds to a predetermined multiple of the rate of arrival of the stream of quantized electrical signals. Counter 13 is coupled to receive the scaling control signal from demultiplexer 12 to provide a separate counter output signal at selected ones of N+S–1 counter output ports $b_0$–$b_{18}$. Letter N represents a predetermined integer larger than S chosen so that $2^N$ and $2^{N-(S-1)}$, respectively, constitute upper and lower decimation ratio bounds of the decimation filter. By way of example, N here is 12 and hence counter 13 is conveniently chosen as a 19-bit "up" counter, although in alternative implementations counter 13 could be readily chosen as a "down" counter or replaced by a twin set of "up/down" counters.

Each adder 14$_0$–14$_{18}$ comprises a full adder having two summand input ports, a carry-in input port, a sum output port and a carry-out output port. As shown in FIG. 5, any two consecutive ones of adders 14$_0$–14$_{18}$ are coupled to one another so that the carry-out output port of one is coupled to the carry-in input port of the other. Further, each respective one of adders 14$_0$–14$_{18}$ includes a respective feedback path for coupling one of the two summand input ports thereof to the sum output port thereof. A plurality of S predetermined ones of adders 14$_0$–14$_{18}$ is separately coupled to a predetermined one of the S demultiplexer output ports to selectively receive at the other summand input port thereof the scaling control signal from demultiplexer 12 (for simplicity of illustration only adders 14$_0$, 14$_2$ and 14$_{14}$ are shown coupled to demultiplexer 12 in the above-described manner). Each remaining adder, that is, any adder not directly coupled to demultiplexer 12, is coupled to receive at the other summand input port thereof a signal having a predetermined level corresponding to a logic "ZERO." Again for simplicity of illustration, only adders 14$_1$ and 14$_{18}$ are shown coupled to receive the logic "ZERO" signal as described above, however, it will be appreciated that odd-numbered adders in the group comprising the first 2(S–1) adders (i.e., adders 14$_1$, 14$_3$, 14$_5$ ... 14$_{13}$), and each adder in the remaining group comprising the last (N–S) adders (i.e., adders 14$_{15}$–14$_{18}$) are respectively connected to receive the logic "ZERO" signal. This adder arrangement conveniently allows counter 13 to start a count sequence at a location which inherently takes into account scaling factor requirements for any desired decimation-ratio selection. A suitable roll-over reset circuit (not shown) can be readily employed to provide a predetermined reset signal to counter 13 upon completion of a desired count sequence. Provision can also be made for providing an externally derived master reset signal (not shown) which allows for suitably resetting the counter and additional circuitry of the decimation filter upon the occurrence of predetermined events such as start of operations.

Figure 8:
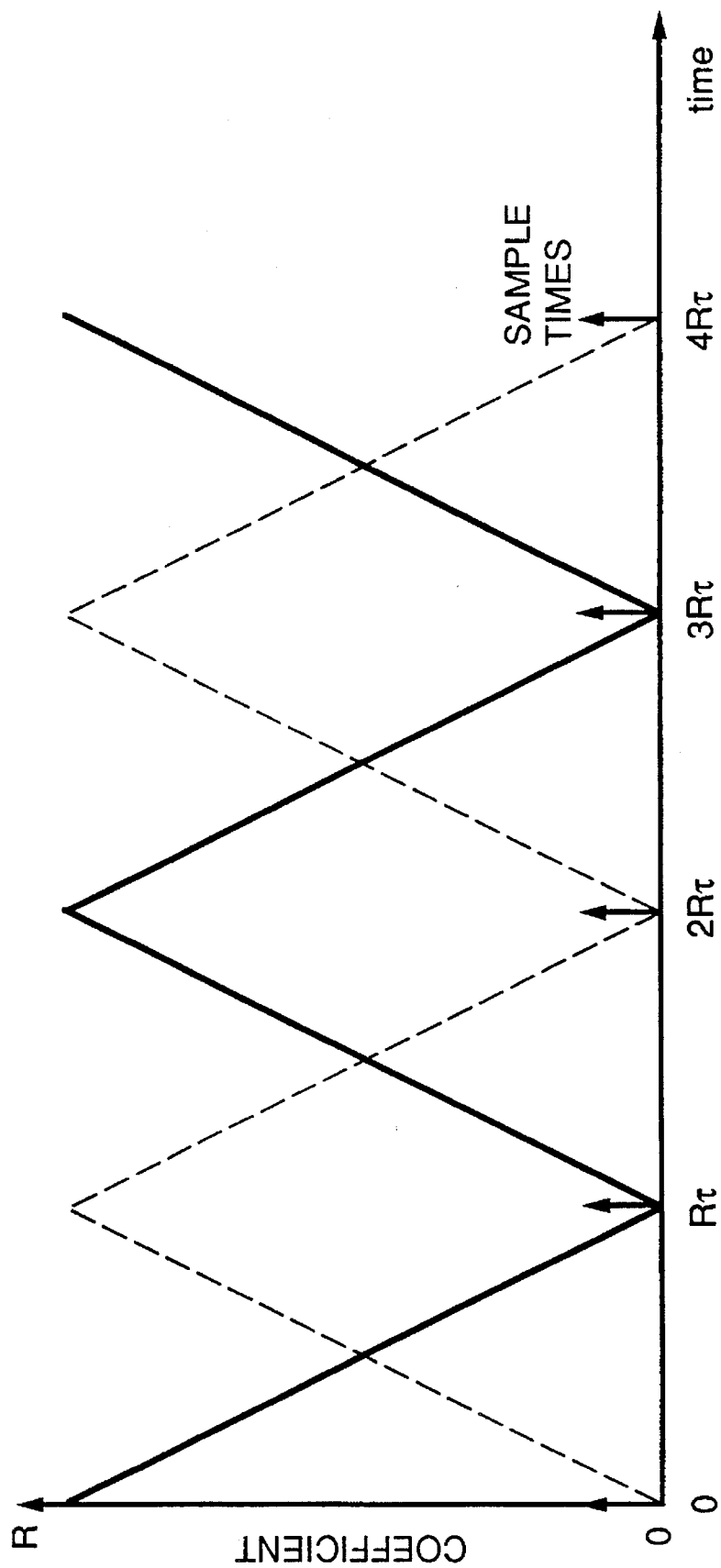
FIG. 8 is a plot of filter coefficients such as may be realized by an embodiment of a decimation filter in accordance with the invention.
Figure 10:
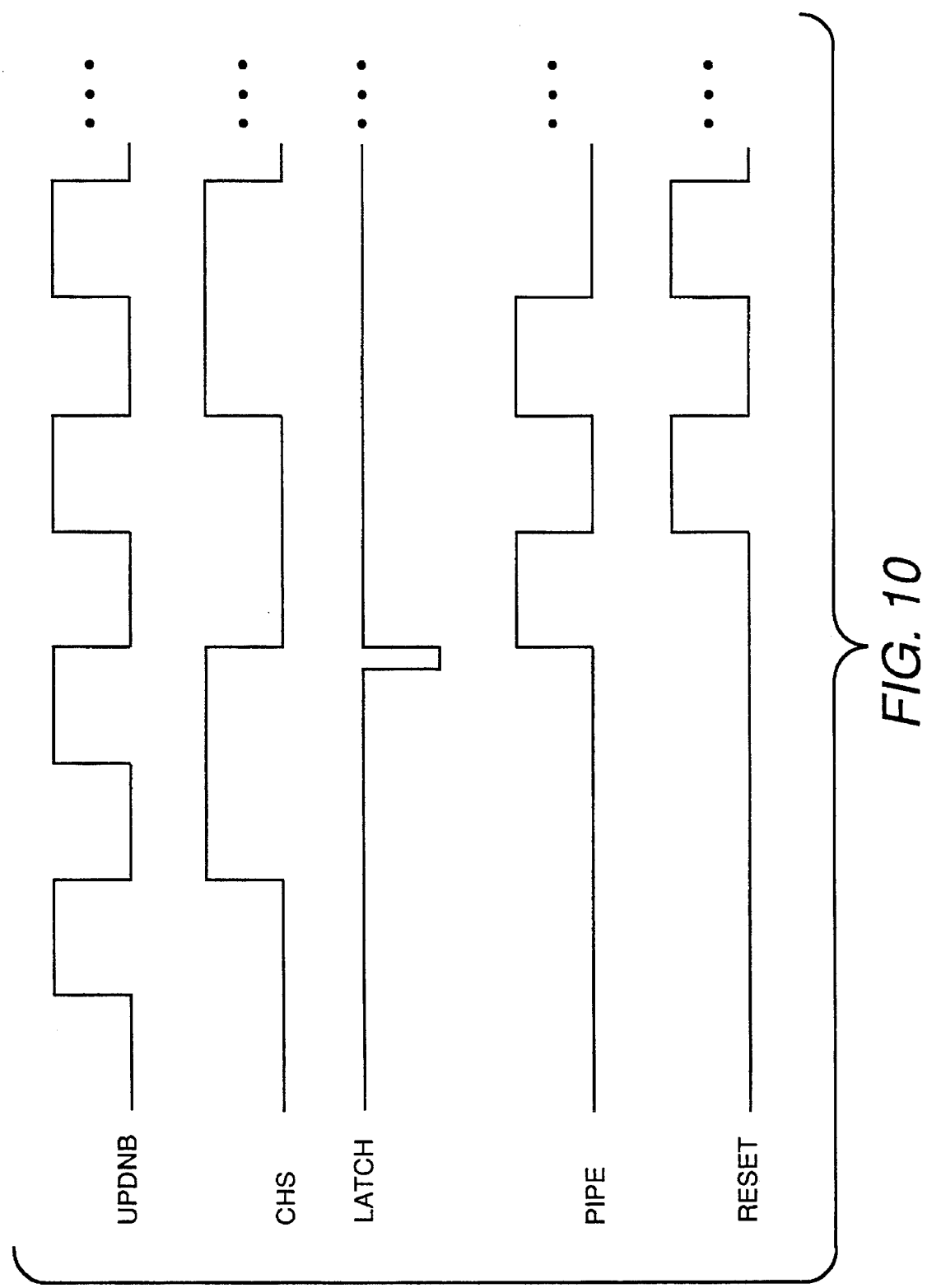
FIG. 10 is a timing diagram showing waveforms associated with the accumulator of FIGS. 9A–9C, plotted as a function of time.

As illustrated in FIG. 5, triangular "window" weights or coefficients are generated after selected counter output signals are inverted by an inverter circuit 18 in response to a suitable inverter control signal UPDNB (waveform shown in FIG. 10). The inversion of the counter output signals allows for generating the down-ramp of the triangular "window" while the uninverted counter output signals in conjunction with a suitable carry-in signal (not shown) allow for generating the up-ramp of the triangular window. This feature of the coefficient generator takes advantage of the fact that the down-ramp of a triangular filter is simply the inverse of the up-ramp, as illustrated in FIG. 8. Other alternative implementations may conveniently provide such triangular "window" coefficients, for example, suitable "up/down" counters can be used in lieu of the "up" counter/inverter arrangement to generate the triangular "window".

It will be appreciated that certain inverter output signals must be zero-filled, as described below, to eliminate errors that would otherwise arise, for example, in the down-ramp of the triangular window due to inversion of zero-valued bits situated beyond or past a predetermined data field. For example, signal inversion causes such zero-valued bits to become one-valued bits which, if left uncompensated, i.e., unzeroed, would introduce the above-mentioned errors to the down ramp. To accomplish the required zero-filling, inverter output signals are coupled to a zero-fill circuit 20 which, in response to the scaling-control signal from demultiplexer 12, provides the separate normalized coefficient signal at each respective one of N+S−1 zero-fill output ports. It will be appreciated that the N+S−1 zero-fill output ports comprise the plurality of output ports of coefficient generator 10.

Figure 6:
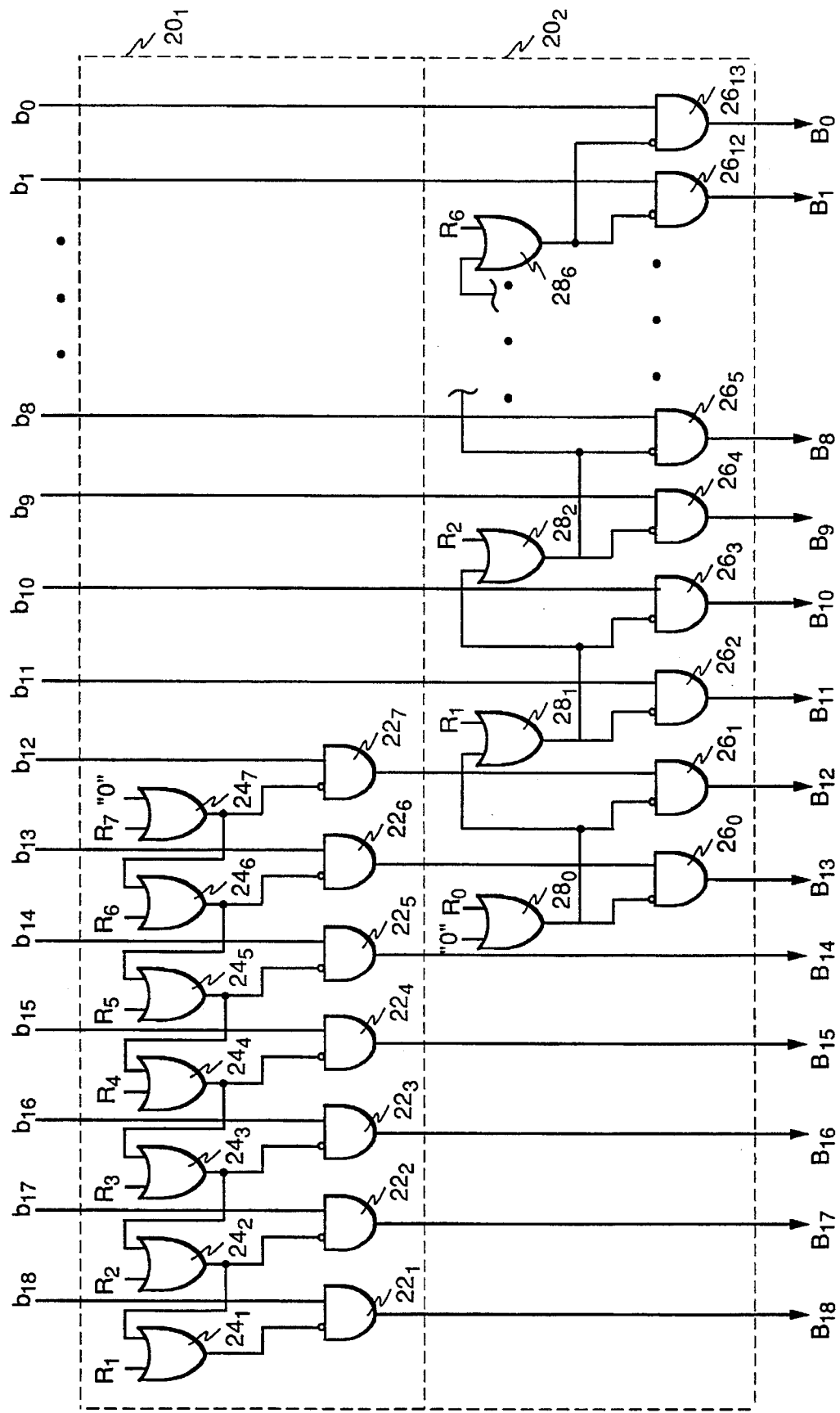
FIG. 6 illustrates the zero-fill circuit of FIG. 5.

FIG. 6 shows an exemplary embodiment of the zero-fill circuit made up of first and second circuits $20_1$ and $20_2$, respectively. To facilitate understanding of the operation of the zero-fill circuit, Table 1 is provided with reference to a decimation filter having an upper decimation ratio bound chosen so that $2^N=4096$ (i.e, N=12); and having a lower decimation ratio chosen so that $2^{N-(S-1)}=32$ (i.e., S=8). It should be appreciated that these respective bounds for the decimation filter are chosen in the manner indicated in Table 1 only by way of example and not of limitation.

response to the scaling control signal from demultiplexer 12. As shown in Table 1, for a decimation ratio of 4096, signals provided by zero-fill output ports $B_{12}$–$B_{18}$ must be respectively filled with zeros since, for such decimation ratio of 4096, only output ports $B_0$–$B_{11}$ are employed to provide the 12-bit data field. For example, for a decimation ratio of 4096, the MSB is represented by letter L and thus inverter output signals supplied at ports $b_{12}$–$b_{18}$ must be set to zero so that the zero-fill circuit provides normalized coefficient signals as designated in the first row of Table 1, which correspond to a scaling factor of unity. In operation, demultiplexer 12 (FIG. 5) supplies the scaling-control signal at its output port $R_7$ whenever the decimation-ratio select signals are in a state or condition such that each has a value corresponding to logic ONE, which correspond to a decimation ratio of 4096. As previously stated, each remaining demultiplexer output port $R_0$–$R_6$ supplies a respective zero signal. Since demultiplexer output port R7 is connected to an input port of OR gate $24_7$, the output signal from OR gate $24_7$, which is directly induced by the scaling-control signal, ripples through OR gates $24_6$–$24_1$. This signal rippling conveniently causes AND gates $22_7$–$22_1$ to supply a zero

TABLE 1

| Input Code For Select Signal ($M_2$, $M_1$, $M_0$) | $B_{18}$ | $B_{17}$ | $B_{16}$ | $B_{15}$ | $B_{14}$ | $B_{13}$ | $B_{12}$ | $B_{11}$ | $B_{10}$ | $B_9$ | $B_8$ | $B_7$ | $B_6$ | $B_5$ | $B_4$ | $B_3$ | $B_2$ | $B_1$ | $B_0$ | # of Bits | Decimation Ratio | Scaling Factor |
|---|---|---|---|---|---|---|---|---|---|---|---|---|---|---|---|---|---|---|---|---|---|---|
| 111 | 0 | 0 | 0 | 0 | 0 | 0 | 0 | L | K | J | I | H | G | F | E | D | C | B | A | 12 | 4096 | 1 |
| 110 | 0 | 0 | 0 | 0 | 0 | 0 | K | J | I | H | G | F | E | D | C | B | A | 0 | 0 | 11 | 2048 | 4 |
| 101 | 0 | 0 | 0 | 0 | 0 | J | I | H | G | F | E | D | C | B | A | 0 | 0 | 0 | 0 | 10 | 1024 | 16 |
| 100 | 0 | 0 | 0 | 0 | I | H | G | F | E | D | C | B | A | 0 | 0 | 0 | 0 | 0 | 0 | 9 | 512 | 64 |
| 011 | 0 | 0 | 0 | H | G | F | E | D | C | B | A | 0 | 0 | 0 | 0 | 0 | 0 | 0 | 0 | 8 | 256 | 256 |
| 010 | 0 | 0 | G | F | E | D | C | B | A | 0 | 0 | 0 | 0 | 0 | 0 | 0 | 0 | 0 | 0 | 7 | 128 | 1024 |
| 001 | 0 | F | E | D | C | B | A | 0 | 0 | 0 | 0 | 0 | 0 | 0 | 0 | 0 | 0 | 0 | 0 | 6 | 64 | 4096 |
| 000 | E | D | C | B | A | 0 | 0 | 0 | 0 | 0 | 0 | 0 | 0 | 0 | 0 | 0 | 0 | 0 | 0 | 5 | 32 | 16384 |

In Table 1 and in FIG. 6, capital letters $B_0$–$B_{18}$ represent the N+S−1 zero-fill circuit output ports while lower case letters $b_0$–$b_{18}$ represent respective ports which supply raw or unzeroed signals produced by the counter and selectively inverted by inverter 18, as described above. Those skilled in the art will appreciate that for a decimation ratio of $2^N$ (here $2^N=4096$) the required scaling factor is equal to unity, that is, a predetermined data field of 12 bits (represented by italic letters A–L), as illustrated in the first row of Table 1, is required to achieve the desired decimation ratio of 4096. As used herein the expression "data field" refers to the variable-length and shiftable data field (represented by respective rectangular boxes in Table 1) employed for accommodating the maximum count sequence generated by counter 13 for any desired decimation ratio.

It can be shown that a set of OR gates $24_1$–$24_7$ and a set of AND gates $22_1$–$22_7$ of first circuit $20_1$ are connected in order to predeterminedly zero-fill inverter output signals past or beyond the most significant bit (MSB) of the data field corresponding to a desired a decimation ratio in signal at their respective output ports, thereby allowing first circuit $20_1$ for achieving the zero-filling past MSB L in accordance with row 1 of Table 1.

Second circuit $20_2$ includes a set of OR gates $28_0$–$28_6$ and a set of AND gates $26_0$–$26_{13}$ which are respectively connected in order to zero-fill inverter signals past the least significant bit (LSB) (here represented by letter A) of the data field for a desired decimation ratio. For a decimation ratio of 4096, it can be seen that since in the first row of table 1 there are no signals past LSB A, in this case, second circuit $20_2$ is not enabled to impart any zero-filling past the LSB of the data field. FIG. 6 shows that a respective input port of AND gates $26_0$ and $26_1$ is coupled to a respective output port of AND gates $22_6$ and $22_7$, respectively. These connections are provided since there may be situations wherein zero-fill output ports $B_{13}$ and $B_{12}$ are respectively situated either past the MSB or past the LSB of the data field, that is, output ports $B_{13}$ and $B_{12}$ are shared or influenced by both the first and second circuits $20_1$ and $20_2$ to correctly handle any such situation. For example, as seen in the last row of Table 1, for a decimation ratio of 32, zero-fill output ports $B_{13}$ and $B_{12}$ supply respective signals which are past the LSB A and therefore, in this case, the zero-filling is imparted or dictated by second circuit $20_2$ whereas, as described above, for a decimation ratio of 4096 output ports $B_{13}$ and $B_{12}$ supply respective signals which are past the MSB L of the data field and therefore the zero-filling is dictated by first circuit $20_1$.

For a decimation ratio of $2^{N-1}=2048$, which is the next available decimation-ratio selection in Table 1, those skilled in the art will appreciate that to achieve proper normalization the zero-fill circuit must provide a scaling factor of four, which is equivalent to shifting two places to the left the least significant bit of a binary representation. Inspection of FIG. 6 reveals that the zero-fill circuit will supply at its respective output ports $B_0$–$B_{18}$ normalized signals as designated in the second row of Table 1. For a decimation ratio of 2048, OR gate $24_6$ (instead of OR gate $24_7$) receives the scaling-control signal. This is because whenever each of decimation-ratio select signals $M_0$–$M_2$ has a respective state represented by 110, then, demultiplexer output port $R_6$, which is connected to a respective input port of OR gate $24_6$ is the demultiplexer output port selected to supply the scaling-control signal. In this case, the output signal from OR gate $24_6$, ripples through OR gates $24_5$–$24_1$ and this causes AND gates $22_6$–$22_1$ to impart a respective zero-fill to signals past bit K which in this case represents the MSB for a data field of 11 bits, as required for a decimation ratio of 2048.

It will be appreciated that for a decimation ratio of 2048, a zero-fill is now required for any signals past LSB bit A since the location of bit A has been shifted two places to the left to accomplish a scaling factor of four, as suggested above. For example, for a decimation ratio of 2048, a respective input port of OR gate $28_6$ receives the scaling-control signal from demultiplexer 12. In this case, the output signal from OR gate $28_6$ causes AND gates $26_{12}$ and $26_{13}$ to impart the required zero-filling past LSB A, as shown in Table 1. It can be shown that first and second circuits $20_1$ and $20_2$ provide respective zero-fillings, as shown in Table 1, so that the zero-fill circuit supplies suitably normalized coefficient signals at its N+S−1 output ports for the various decimation ratios provided by the decimation filter. Those skilled in the art will appreciate that the combinational logic of the first and second circuits $20_1$ and $20_2$ due to their respective regularity of design can be readily expanded to accommodate additional numbers of decimation ratio selections. Such expansion can advantageously be made in a manner that efficiently saves chip area and power consumption since complexity of design does not increase as a function of the number of decimation ratios provided by the decimation filter.

Figure 9:
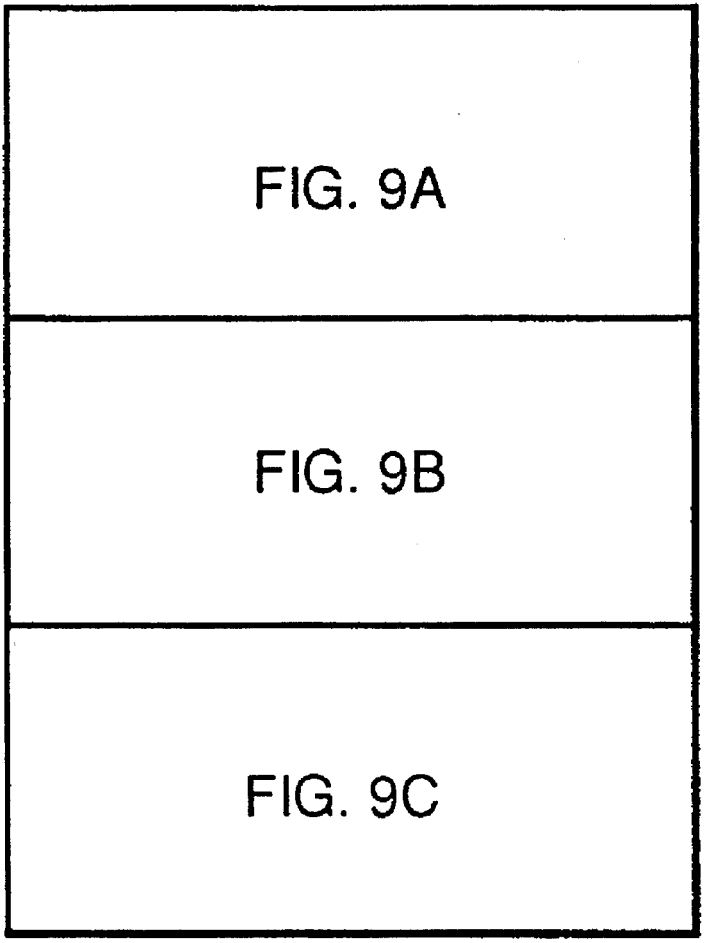
FIG. 9 is a block diagram showing how
Figure 9A:
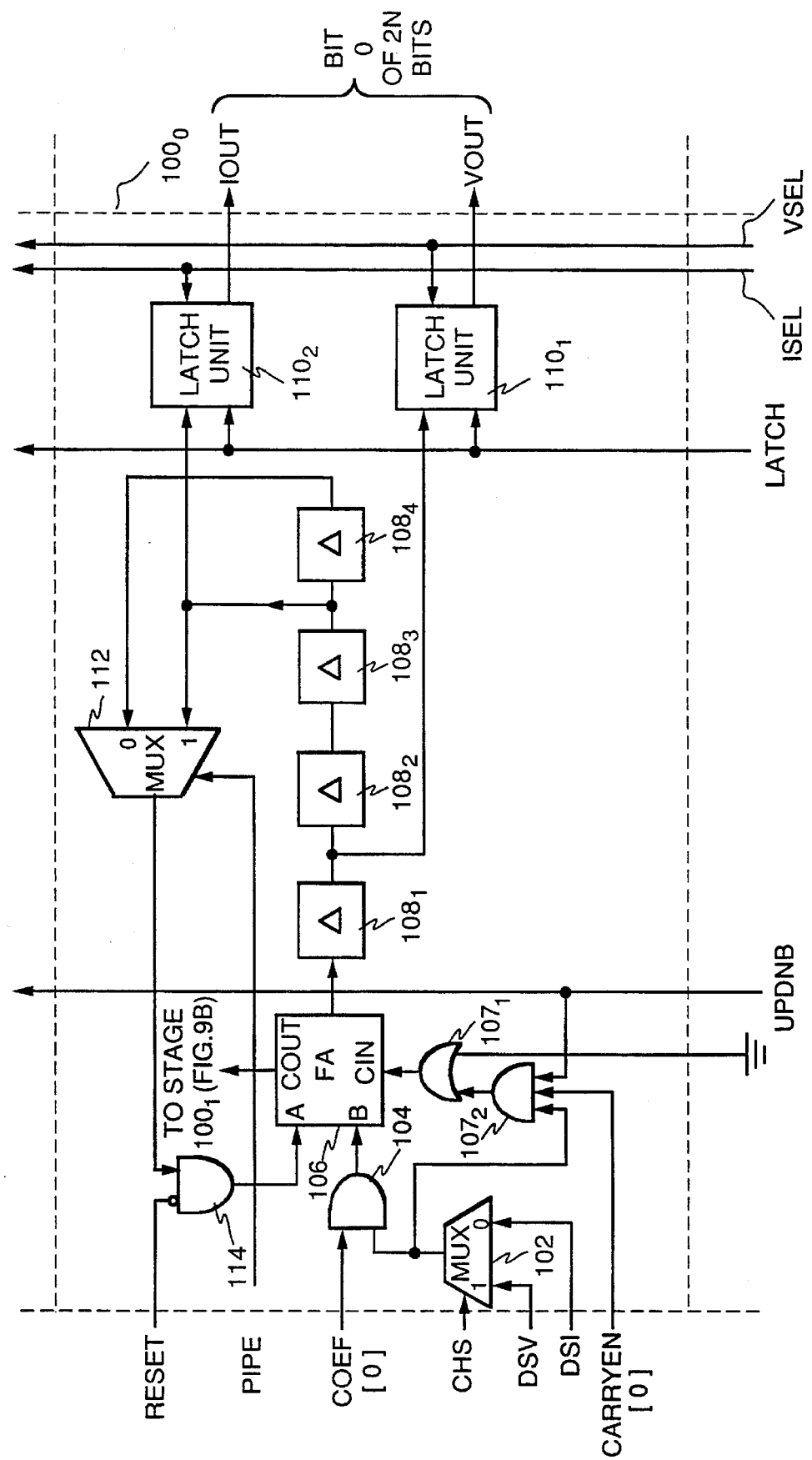
FIGS. 9A–9C illustrate respective exemplary multi-channel stages for one embodiment of the accumulator of FIG. 4 in accordance with the invention.
Figure 9B:
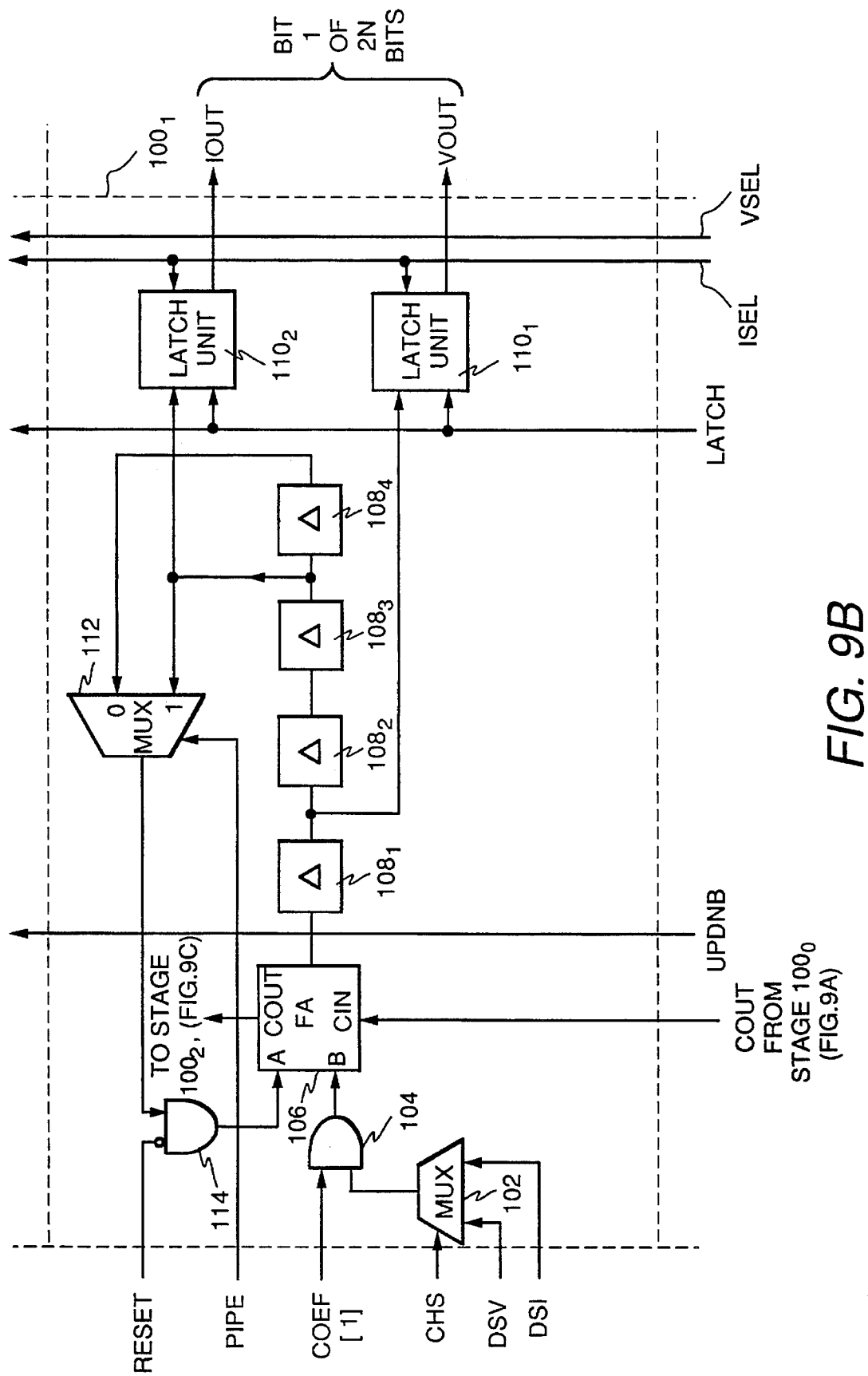
Figure 9C:
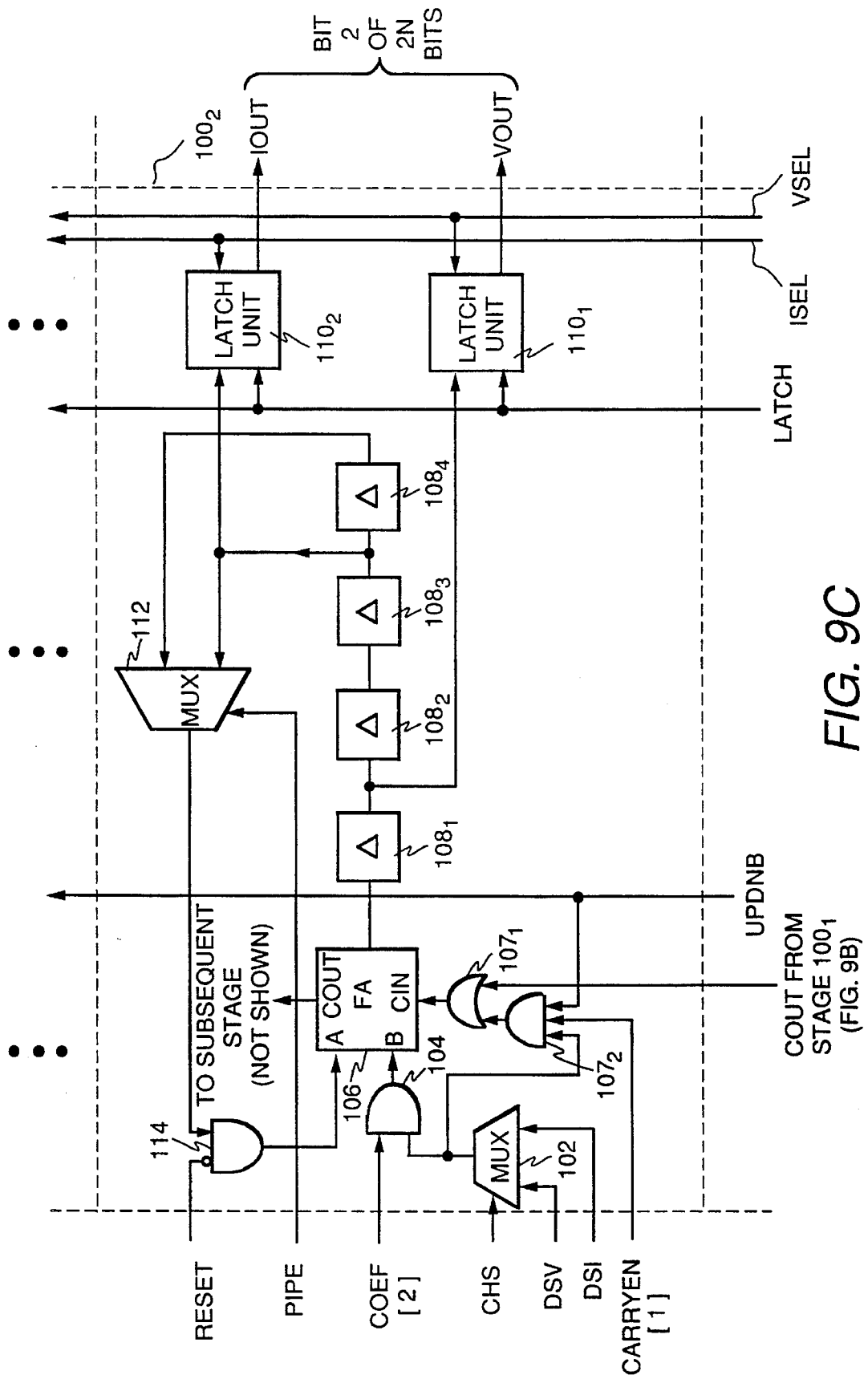

FIG. 9 (i.e., FIGS. 9A–9C, considered as an assemblage) illustrates an exemplary embodiment for accumulator 100 (FIG. 4). The embodiment of FIG. 9 shows, for the purpose of simplicity of explanation, only three stages $100_0$–$100_2$ of a 2N-bit accumulator comprising a number of 2N stages, each adapted to generate a respective one of the 2N accumulator bits. FIG. 9 shows that each stage is a multi-channel stage that includes a respective signal-stream multiplexer 102 having two input ports.

FIG. 9 can be conveniently used in conjunction with FIG. 10 to explain in more detail operational aspects of the accumulator. For example, during respective cycles of multiplexer control signal CHS (waveform shown in FIG. 10), multiplexer 102 supplies to AND gate 104 a respective stream of quantization signals, such as stream of signals DSV and the additional stream of signals DSI, each of which constitutes a respective modulator signal output. In accordance with this embodiment of the invention, decimation filter signal outputs may be produced by multiplying or masking each modulator signal output, such as signals DSV and DSI which may represent voltage and current measurements, respectively, with the normalized coefficient, or zero-fill circuit signal outputs. FIG. 8 illustrates the time domain representation of the coefficients employed in the processing performed by the programmable decimator filter, that is, a decimation filter which is capable of being programmed to provide different decimation ratios as discussed in the context of Table 1 and FIG. 6.

Multiplication of the quantized electrical signals by the coefficient is conveniently performed at each respective stage by AND gate 104, by masking the output signals from coefficient generator 10 (FIG. 4) with each sigma-delta modulator output signal. Each AND gate 104 of the accumulator has two input ports and an output port. A respective one of the two input ports is coupled to receive the output signal from multiplexer 102. The other AND gate 104 input port is coupled to receive a respective normalized coefficient signal (designated COEF[0], COEF[1], and COEF[2] in FIGS. 9A, 9B and 9C, respectively) from the zero-fill circuit. It will be appreciated that the coefficient signal received by the last N−(S+1) (here 5) respective stages of the 2N (here 24) accumulator stages is simply set to zero since the zero-fill circuit is designed to supply only N+(S+1) (here 19) coefficient signals.

The output signal of AND gate 104 is supplied to one summand input port of a suitable full adder (FA) 106 having two summand input ports and a sum output port for supplying respective cumulative masked output signals. Adder 106 is coupled to receive masked signals from AND gate 104 at a respective one of the summand input ports. Adder 106 has a carry-in input port for receiving a carry-in signal, if any, and a carry-out output port coupled to a subsequent of the 2N stages for passing a carry-out signal to the subsequent stage, except the last stage wherein the carry-out output port is coupled to overflow detector 200 (FIG. 4). It will be appreciated by those skilled in the art that depending on the decimation ratio selected, not every carry-in input port in the accumulator has to be enabled at each stage; thus, to reduce computational burden, a predetermined enabling signal CARRYEN, suitably combined in logical gates $107_1$ and $107_2$, conveniently enables or disables predetermined ones of the carry-in input ports in the accumulator, depending on the decimation ratio being selected by the user.

In each stage, delay means, such as serially connected delay units $108_1$–$108_4$, impart a respective delay to the cumulative masked output signals from adder 106. Each respective delay is imparted at predetermined cycles of a suitable delay unit clocking signal (not shown) being received at a suitable clock port of each delay unit and predeterminedly synchronized with the rate of arrival of the stream of quantized signals. It will be appreciated that the delay units cooperate to provide in a time multiplexed manner of operation respective filter output signals. For example, after a complete number of accumulator cycles during which a triangular "window" has been formed, the content of predetermined delay units is latched into a respective set of latching units $110_1$ and $110_2$ in response to a LATCH signal that pulses to ZERO from its normal ONE state (waveform being shown in FIG. 10). It should now be appreciated that for the embodiment of FIG. 9, such time-multiplexed operation, conveniently allows for consecutive "windows" to overlap, (as shown in FIG. 8) resulting in the first zero of the triangular "window" filter occurring at the selected decimation frequency. A multiplexer 112 is coupled to respective delay means (e.g., $108_3$ and $108_4$) for providing two-separate feedback paths which are in turn selectively coupled to the other of the two summand input ports of adder 106 in response to a PIPE signal (waveform shown in FIG. 10) applied to multiplexer 112. It can be shown that this arrangement conveniently allows for computation of the suggested overlapping consecutive "windows". As shown in the embodiment of FIG. 9, first delay delay unit $108_1$, is coupled to directly receive the cumulative output signal from adder 106 while third and fourth delay units $108_3$ and $108_4$, respectively, are selectively coupled to the other summand input port of adder 106 through a respective one of the two feedback paths provided by multiplexer 112 whenever the PIPE signals reaches one of two predetermined levels. Decimation filter output samples or signals may be latched by the embodiment illustrated in FIG. 9 at the times indicated by the arrows in FIG. 8.

As will be appreciated by those skilled in the art, a required decimation ratio may be determined based upon the desired bandwidth, assuming that a triangular "window" decimation filter embodiment is desirable. Although this particular embodiment of the invention implements a triangular filter, it will be appreciated that a rectangular filter may likewise be implemented. Upon completion of a triangular "window" accumulation, a suitable RESET signal (waveform shown in FIG. 10) is employed for suitably resetting summer 116 for computation of the next triangular "window". For example, AND gate 114 provides one exemplary implementation for supplying the RESET signal to summer 106. Signals ISEL and VSEL can be provided by a suitable microprocessor (not shown) in order to read out a respective filtered output signal from the latch set $110_1$–$110_2$.

Figure 11:
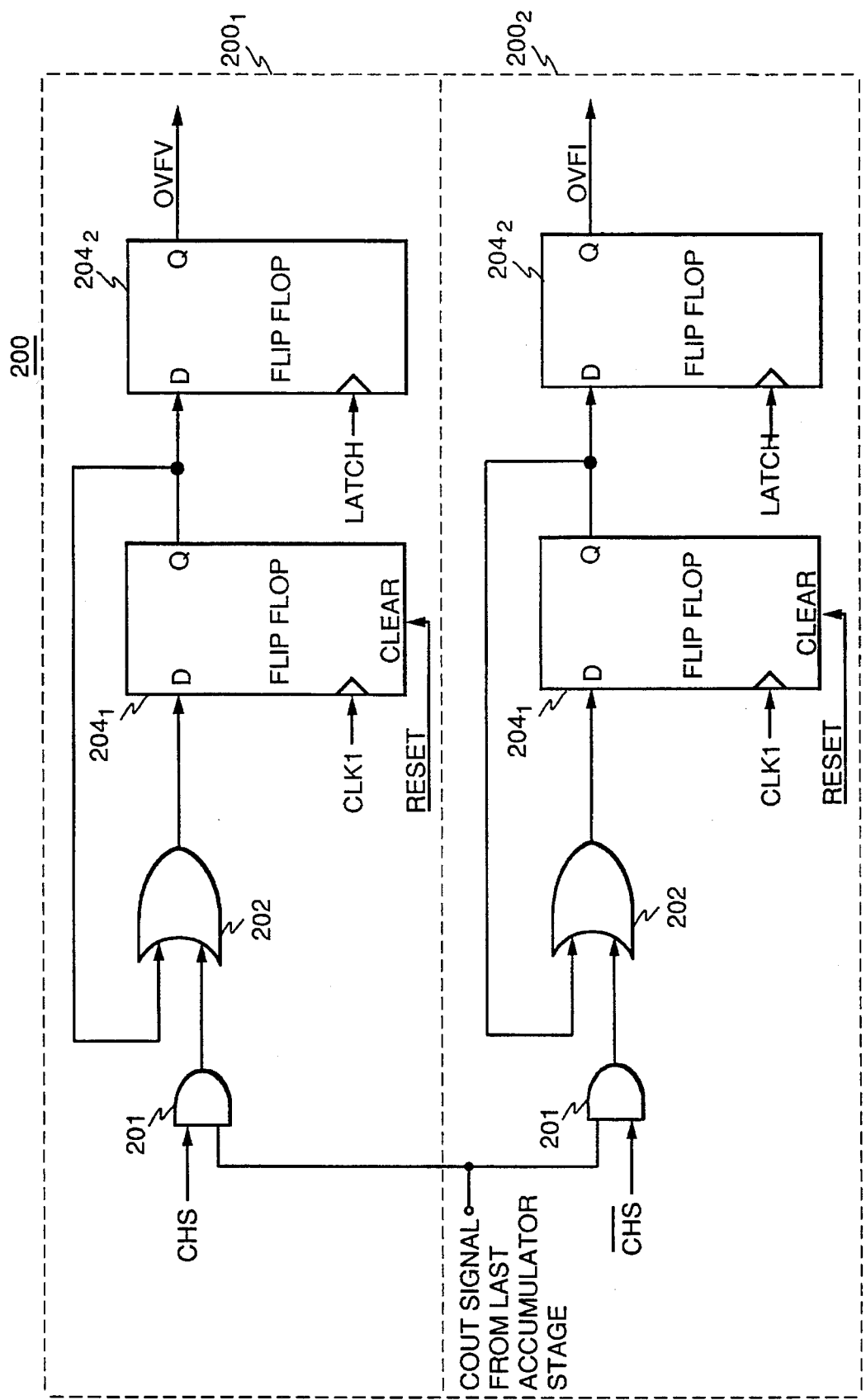
FIG. 11 is a block diagram showing details for one exemplary embodiment of the overflow detector of FIG. 4.

FIG. 11 shows an exemplary embodiment of overflow detector 200 comprising suitable detector stages, such as detector stages $200_1$ and $200_2$, for detecting a respective overflow condition in accumulator 100 (FIG. 4 and FIG. 9) due to one of the externally derived quantizing signals being supplied at full scale. Each detector stage includes a respective AND gate 201 coupled to supply a signal indicative of the origin of a respective overflow condition. In this embodiment, AND gate 201 in detector stage $200_1$ is coupled to combine the carry-out signal from the last accumulator stage with signal CHS while AND gate 201 in detector stage $200_2$ is coupled to combine the same carry-out signal with the complement of signal CHS. Such arrangement for AND gates 201 conveniently allows for determining in a multichannel architecture which is the specific channel of accumulator 100 experiencing a respective overflow condition. This follows since signal CHS and its complement, when coupled to AND gates 201 as shown, allow for determining which modulator signal output is being accumulated within any giving accumulating cycle. Each detector stage further includes suitable latching units, such as flip-flops $204_1$ and $204_2$, which cooperate to latch or grab any signal or bit indicative of a respective overflow condition. In each detector stage an OR gate 202 is coupled to combine the output signal from a respective AND gate 201 with the signal indicative of the present state of a respective flip-flop $204_1$ clocked by a suitable signal CLK1 substantially synchronized with the clocking signal for the delay units discussed in the context of FIG. 9. Similarly, flip-flop $204_2$ is clocked by the LATCH signal (waveform shown in FIG. 10) so that upon completion of a triangular "window" each respective flip-flop $204_2$ can separately reach a respective present state which enables signal OVFV and OVFI, respectively, and which is indicative of a respective overflow condition. It will be appreciated that the RESET signal (waveform shown in FIG. 10) applied at a respective flip-flop CLEAR port allows each flip-flop $204_1$ to be suitably reset upon commencement of a subsequent triangular "window". Each respective overflow indication signal in turn is supplied to suitable combinational logical gates (not shown) in order to correct any overflow condition; for example, an "ORing" technique can be used for setting each accumulator output signal to ONE. In this manner, the overflow detector advantageously allows the decimation filter to advantageously operate at decimation ratios as low as 32, for example, without any distortion to its magnitude response.

Decimation filtering at least one stream of externally derived binary signals in accordance with the present invention may be accomplished by the following method. As exemplified in the embodiment for the programmable decimation filter illustrated in FIG. 4, a predetermined sequence of normalized coefficient signals is generated, such as by coefficient generator 10, in response to a set of externally derived decimation-rate select signals. An externally derived stream of binary signals is received, such as from a delta-sigma modulator. For instance, the externally derived stream may comprise a single bit signal stream from a one-bit sigma delta modulator. The received externally derived stream of binary signals is masked or multiplied, such as with an AND gate having two input ports and an output port, with the predetermined sequence of normalized coefficient signals and the masked signals are then suitably accumulated, such as by multibit accumulator 100, to provide a filtered signal. The step of generating the predetermined sequence of normalized coefficient signals comprises the steps of: providing at a selected one of S demultiplexer output ports a predetermined scaling-control signal wherein S is a predetermined integer corresponding to a number of selectable decimation ratios provided by the decimation filter; generating a separate counter signal at selected ones of (N+S−1) counter output ports wherein N is a predetermined integer chosen so that 2N and $2^{N-(S-1)}$, respectively, constitute upper and lower decimation ratio bounds of the decimation filter; and generating N+S−1 normalized signals upon predeterminedly zero-filling respective ones of of the generated (N+S−1) counter output signals. As explained in the context of FIG. 5, prior to generating the N+S−1 normalized signals selectively inverting the counter output signals conveniently allows for generating the down ramp of the triangular window.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A decimation filter having a selectable decimation ratio for filtering at least one externally derived stream of quantized electrical signals having a predetermined rate, said filter comprising:

a coefficient generator responsive to a set of externally derived decimation-ratio select signals to provide a separate predeterminedly normalized coefficient signal at each respective one of a plurality of output ports;

said coefficient generator comprising:

a demultiplexer unit responsive to the set of externally derived decimation-ratio select signals to provide at a selected one of S demultiplexer output ports a predetermined scaling-control output signal, wherein S is a predetermined integer corresponding to a number of selectable decimation ratios provided by said decimation filter;

an (N+S−1)-bit counter responsive to a predetermined counter clock signal and coupled to receive the scaling-control signal from said demultiplexer unit to provide a separate counter output signal at selected ones of N+S−1 counter output ports, wherein N is a predetermined integer chosen so that $2^N$ and $2^{N-(S-1)}$, respectively, constitute upper and lower decimation ratio bounds of said decimation filter;

an inverter circuit coupled to said counter circuit to receive each counter output signal, said inverter responsive to an inverter control signal to selectively invert or not each received counter output signal; and a zero-fill circuit coupled to receive each output signal from said inverter circuit and responsive to the scaling-control output signal from the demultiplexer unit to provide the separate normalized coefficient signals at each respective one of N+S−1 zero-fill circuit output ports which comprise the plurality of output ports of said coefficient generator;

an accumulator coupled to said coefficient generator to receive each normalized coefficient signal generated therein, said accumulator further coupled to receive said at least one stream of quantized electrical signals so as to produce, upon masking with respective ones of the received normalized coefficient signals, a plurality of accumulator output signals; and an overflow detector coupled to said accumulator to detect an overflow condition in said accumulator.

2. The decimation filter of claim 1 wherein said counter comprises a plurality of N+S−1 adders.

3. The decimation filter of claim 2 wherein each of said plurality of N+S−1 adders comprises a full adder having two summand input ports, a carry-in input port, a sum output port and a carry-out output port and wherein any two consecutive ones of said plurality of full adders are coupled to one another so that the carry-out output port of one is coupled to the carry-in input port of the other; and each respective one of said plurality of full adders having a respective feedback path for coupling one of the two summand input ports thereof to the sum output port thereof, a plurality of S predetermined ones of said adders separately coupled to a predetermined one of the S demultiplexer output ports to respectively receive at the other summand input port thereof the scaling-control signal from said demultiplexer unit, each remaining full adder respectively coupled to receive at the other summand input port thereof a predetermined signal corresponding to a logic zero.

4. The decimation filter of claim 3 wherein said first circuit comprises respective sets of "AND" and "OR" gates connected to ripple through any received scaling-control signal.

5. The decimation filter of claim 3 wherein said second circuit comprises respective sets of "AND" and "OR" gates connected to ripple through any received scaling-control signal.

6. The decimation filter of claim 2 wherein said zero-fill circuit comprises a first circuit coupled to predetermined ones of the demultiplexer output ports to selectively receive the scaling-control signal therein to predeterminedly zero-fill selected inverter output signals past a most significant bit of a predetermined data field corresponding to a desired decimation ratio and further comprises a second circuit coupled to predetermined ones of the demultiplexer output ports to selectively receive the scaling-control signal therein to predeterminedly zero-fill selected inverter output signals past a least significant bit of the data field corresponding to the desired decimation ratio.

7. The decimation filter of claim 1 wherein said accumulator comprises a 2N-bit accumulator.

8. The decimation filter of claim 7 wherein said accumulator comprises a number of 2N stages each adapted to generate a respective one of the 2N accumulator bits.

9. The decimation filter of claim 8 wherein each of said 2N stages comprises a respective multi-channel stage.

10. The decimation filter of claim 9 wherein each respective multi-channel stage comprises:

a signal-stream multiplexer having two input ports, said signal-stream multiplexer coupled to receive at least said one respective stream of quantization signals at a respective one of the two input ports of said multiplexer and an additional respective stream of quantization signals at the other of the two input ports thereof;

an "AND" gate having two input ports and being coupled to receive an output signal from said signal-stream multiplexer at a respective one of the two gate input ports, said gate being adapted to mask each respective normalized coefficient signal being supplied by said zero-fill circuit and received at the other input port of said gate with each respective one of the stream of quantization signals so as to supply masked signals at an output port thereof;

an adder having two summand input ports and a sum output port for supplying respective cumulative masked output signals, said adder coupled to receive masked signals from said gate at a respective one of said two summand input ports, said adder having a carry-in input port for receiving a carry-in signal and a carry-out output port coupled to a subsequent one of said 2N stages for passing a carry-out signal to said subsequent stage, except the last stage wherein said carry-out output port is coupled to said overflow detector;

a set of respective delay units each imparting a predetermined delay to the cumulative output signals from said adder;

a two-to-one multiplexer to selectively couple predetermined ones of the delay units in two separate feedback paths to the other of said two summand input ports in response to a pipe signal applied to said two-to-one multiplexer; and a pair of latching units respectively coupled to predetermined ones of the delay units to provide in response to a latch clock signal a respective filtered output signal.

11. The decimation filter of claim 10 wherein the set of delay units comprises four respective delay units coupled in series.

12. The decimation filter of claim 11 wherein a first one of said delay units is coupled to directly receive the cumulative output signal from said adder, and the fourth one of said delay units is selectively coupled to the other of said summand input ports through a respective one of the two feedback paths whenever the pipe signal reaches one of two predetermined levels.

13. The decimation filter of claim 12 wherein the third one of said delay units is selectively coupled to the other of said summand input ports through the other of the two feedback paths whenever the pipe signal reaches the other of the two predetermined levels.

14. The decimation filter of claim 1 wherein N=12 and S=8.

15. The decimation filter of claim 10 wherein each respective stream of quantized electrical signals comprises a single bit signal stream from a respective one-bit sigma-delta modulator.

16. A decimation filter having a selectable decimation ratio for filtering at least one externally derived stream of quantized electrical signals having a predetermined rate, said filter comprising:

a single monolithic electronic integrated circuit chip incorporating at least one sigma-delta modulator providing a single bit stream of binary electrical signals;

said chip further including:

a coefficient generator responsive to a set of externally derived decimation-ratio select signals to provide a separate predeterminedly normalized coefficient signal at each respective one of a plurality of output ports;

said coefficient generator comprising:

a demultiplexer unit responsive to the set of externally derived decimation-ratio select signals to provide at a selected one of S demultiplexer output ports a predetermined scaling-control output signal, wherein S is a predetermined integer corresponding to a number of selectable decimation ratios provided by said decimation filter;

an (N+S−1)-bit counter responsive to a predetermined counter clock signal and coupled to receive the scaling-control signal from said demultiplexer unit to provide a separate counter output signal at selected ones of N+S−1 counter output ports, wherein N is a predetermined integer chosen so that $2^N$ and $2^{N-(S-1)}$, respectively, constitute upper and lower decimation ratio bounds of said decimation filter;

an inverter circuit coupled to said counter circuit to receive each counter output signal, said inverter responsive to an inverter control signal to selectively invert or not each received counter output signal; and a zero-fill circuit coupled to receive each output signal from said inverter circuit and responsive to the scaling-control output signal from the demultiplexer unit to provide the separate normalized coefficient signals at each respective one of N+S−1 zero-fill circuit output ports which comprise the plurality of output ports of said coefficient generator;

an accumulator coupled to said coefficient generator to receive each normalized coefficient signal generated therein, said accumulator further coupled to receive said at least one stream of quantized electrical signals so as to produce, upon masking with respective ones of the received normalized coefficient signals, a plurality of accumulator output signals; and an overflow detector coupled to said accumulator to detect any overflow condition in said accumulator.

17. A method for decimation filtering at least one stream of externally derived binary signals, said method comprising the steps of:

generating a predetermined sequence of normalized coefficient signals in response to a set of externally derived decimation-rate select signals;

said step of generating the predetermined sequence of normalized coefficient signals comprising:

providing at a selected one of S demultiplexer output ports a predetermined scaling-control signal wherein S is a predetermined integer corresponding to a number of selectable decimation ratios provided therein;

generating a separate counter signal at selected ones of (N+S−1) counter output ports wherein N is a predetermined integer chosen so that $2^N$ and $2^{N-(S-1)}$, respectively, constitute upper and lower decimation ratio bounds; and generating N+S−1 normalized signals upon predeterminedly zero-filling respective ones of of the generated (N+S−1) counter output signals; and receiving said at least one stream of externally derived binary signals;

masking said received stream of externally derived binary signals with said predetermined sequence of normalized coefficient signals; and accumulating the masked signals to provide a filtered signal.

18. The method of claim 17 further comprising the steps of detecting and correcting any overflow condition during the accumulating step.

19. The method of claim 18 Wherein said at least one stream of externally derived binary signals comprises a single bit signal stream from a one-bit sigma delta modulator.

* * * * *